United States Patent
Chandaria (10) Patent No.: US 11,447,358 B2
(45) Date of Patent: Sep. 20, 2022

(54) TAPE DISPENSER HAVING TWO SIDED CUTTER BLADE AND METHOD OF MANUFACTURE

(71) Applicant: Kitaru Innovations Inc., St. Michael (BB)

(72) Inventor: Shernee Chandaria, Toronto (CA)

(73) Assignee: Kitaru Innovations Inc., St. Michael (BB)

(*) Notice: Subject to any disclaimer, the term of this patent is extended or adjusted under 35 U.S.C. 154(b) by 165 days.

(21) Appl. No.: 16/832,159

(22) Filed: Mar. 27, 2020

(65) Prior Publication Data
US 2021/0300713 A1    Sep. 30, 2021

(51) Int. Cl.
*B65H 35/00*    (2006.01)

(52) U.S. Cl.
CPC ....... *B65H 35/0026* (2013.01); *B65H 35/008* (2013.01); *B65H 2701/377* (2013.01)

(58) Field of Classification Search
CPC .......................... B65H 35/0026; B65H 35/008
See application file for complete search history.

(56) References Cited

U.S. PATENT DOCUMENTS

| | | | |
|---|---|---|---|
| 3,508,692 A * | 4/1970 | Holtan | B65H 35/0026 225/33 |
| 4,447,281 A | 5/1984 | Joy | |
| 6,098,690 A * | 8/2000 | Robichaud | B65H 37/007 156/577 |
| 2004/0060956 A1* | 4/2004 | Chandaria | B65H 35/0026 225/25 |
| 2008/0271853 A1 | 11/2008 | Steele et al. | |
| 2014/0263525 A1* | 9/2014 | Chen | B65H 35/008 225/77 |
| 2018/0370749 A1* | 12/2018 | Chu | B26D 7/2614 |

FOREIGN PATENT DOCUMENTS

| | | |
|---|---|---|
| DE | 10131037 | 1/2003 |
| WO | 2019106394 | 6/2019 |

* cited by examiner

*Primary Examiner* — Alex B Efta
(74) *Attorney, Agent, or Firm* — Sand, Sebolt & Wernow Co., LPA (57) ABSTRACT

A tape dispenser has a cutter or cutting blade that has at least two rows of teeth opposite each other relative to the cutter or cutting blade. The blade is to be installed on the tape dispenser in any of at least two orientations. By installing the blade in any of at least two orientations, at least one row of teeth will always project from the dispensing end to cut adhesive tape as it is unwound from a roll after being dispensed. This type of blade permits an easier manufacturing ability by reducing or eliminating the need to ensure proper alignment of the teeth to project outwardly from the tape dispenser housing.

15 Claims, 8 Drawing Sheets

TAPE DISPENSER HAVING TWO SIDED CUTTER BLADE AND METHOD OF MANUFACTURE

TECHNICAL FIELD

The present disclosure relates generally to tape dispensers. More particularly, the present disclosure relates to a cutter blade for a tape dispenser. Specifically, the present disclosure relates to a cutter blade having two rows of teeth that enable the cutter blade to be quickly installed in a tape dispenser to eliminate the need of ensuring that teeth properly project to cut adhesive tape dispensed to a desired length.

BACKGROUND

Tape dispensers are useful to dispense wound adhesive tape from a roll. Generally, there are two types of tape dispensers. There are reusable tape dispensers and disposable tape dispensers. Reusable tape dispensers have a frame or housing that is formed from a substantially rigid material that is often metal or plastic. The reusable tape dispenser often has a hub that is rotatably supported by the frame or housing. Then, a roll of wound adhesive tape slidably receives the hub and rotates with the same during unwinding of the adhesive tape. Similarly, disposable tape dispensers have a hub, which is often fixed, that allows a wound roll of adhesive tape to rotate about during unwinding of the tape.

Regardless of the type of tape dispenser, whether reusable or disposable, each tape dispenser includes a cutter blade to cut the dispensed tape to a desired length. The cutter blade has teeth that protrude or project outwardly from the frame of the tape dispenser. In most tape dispensers, the teeth on the cutter blade project upwardly, however there are a minority of tape dispensers that have teeth that project outwardly in a different direction, such as handheld tape dispensers that have teeth that project downwardly.

The cutter blades on the tape dispensers are formed from a generally planar blade that has first and second sides that bound opposing major surfaces. A single row of teeth are formed along an upper or first edge extending fully between the first and second sides. Opposite the teeth formed in the first edge, most cutter blades have a flat bottom or second edge extending between the first and second sides. Other cutter blades have a bottom or second edge interrupted by one or two slots that are used to couple the blade to mounting pins in the tape dispenser frame or housing. Regardless of whether the blade includes or does not include slots in the bottom edge, cutter blades do not have a row of teeth that are along the bottom or second edge. The reason there are no teeth along the bottom or second edge is because the bottom edge is never used to cut the adhesive tape, and thus, teeth along the bottom or second edge is functionally pointless with respect to cutting the tape.

To assemble the tape dispenser, the cutter blade must be aligned and oriented in a manner to ensure that the teeth on the cutter blade project outwardly to ensure that the cutter blade will cut the adhesive tape after being dispensed to a desired length by the user.

SUMMARY

It has recently been determined that the assembly of the tape dispenser can be improved. Namely, inasmuch as the teeth on the cutter blade only have a single row of teeth, great care must be taken by an assembly machine or assembly person to ensure that the teeth on the blade project outwardly to cut the tape after being dispensed to a desired length. The manufacturing process requires the step of ensuring that the teeth project outwardly towards the tape because the cutter blade only has one row of teeth. As such, increased time is imparted into the manufacturing process by requiring the proper alignment of the cutter blade. Thus, a need continues to exist for device and method for increasing manufacturing efficiency of a tape dispenser, regardless of whether the tape dispenser is reusable or disposable. To address this continuing need, the present disclosure provides a cutter blade that has two rows of teeth. There is a first row of teeth along a first longitudinal edge (usually the upper edge) and a second row of teeth along a second longitudinal edge (usually the lower edge). This forms a cutter blade that is symmetrical. As such, the symmetrical blade can be quickly installed on the dispenser without the need to ensure that the teeth are properly aligned because a row of teeth will properly project from the housing regardless of how the blade is installed. Stated otherwise, a dual-sided cutter blade eliminates a manufacturing step and thus increases overall efficiency in manufacture without added manufacturing cost, weight, or time. As such, aspects of the present disclosure relate to an improved tape dispenser having a two-sided cutter blade and a method of manufacture that eliminates the step of ensure that the teeth on the cutter blade are facing the correct cutting/projecting direction.

In one aspect, an exemplary embodiment of the present disclosure may provide a tape dispenser comprising: a housing sized to dispense adhesive tape wound in a roll carried by the housing; a dispensing end of the housing; a blade adjacent the dispensing end of the housing to cut the adhesive tape after a portion of adhesive tape is unwound from the roll; at least two rows of teeth on the blade. This exemplary embodiment or another exemplary embodiment may further provide wherein the two rows of teeth on the blade comprises: a first row of teeth facing a first direction; and a second row of teeth facing a second direction that is different than the first direction. This exemplary embodiment or another exemplary embodiment may further provide wherein the first direction is about 180° from the second direction. This exemplary embodiment or another exemplary embodiment may further provide wherein the blade comprises: a first side edge and a second side edge; a first major surface opposite a second major surface, wherein the first and second major surfaces are bounded between the first side edge and the second side edge; wherein the at least two rows of teeth on the blade includes a first row of teeth extending between the first side edge and the second side edge and bounding the first and second major surfaces; wherein the at least two rows of teeth on the blade includes a second row of teeth extending between the first side edge and the second side edge and bounding the first and second major surfaces. This exemplary embodiment or another exemplary embodiment may further provide: an upper end of the blade defined by the first row of teeth; and a lower end of the blade defined by the second row of teeth. This exemplary embodiment or another exemplary embodiment may further provide a bend in the blade between the upper end and the lower end. This exemplary embodiment or another exemplary embodiment may further provide wherein bend is located approximately halfway between the upper end of the blade and the lower end of the blade and extends fully from the first side edge to the second side edge. This exemplary embodiment or another exemplary embodiment may further provide wherein the bend in the blade defines a convex portion on the first major surface and a concave portion on the second major surface. This exemplary embodiment or another exemplary embodiment may further provide a channel defined by the bend extending laterally along the second major surface of the blade from the first side edge to the second side edge. This exemplary embodiment or another exemplary embodiment may further provide a slot formed near the dispensing end of the housing, wherein the slot is shaped complementary to a profile shape of the blade. This exemplary embodiment or another exemplary embodiment may further provide an internal projection in the housing near the dispensing end of the housing, wherein the internal projection is disposed within the channel adapted to retain the blade in a fixed position. This exemplary embodiment or another exemplary embodiment may further provide a fixed connection of the blade to the housing to preclude the second row of teeth from ever contacting the adhesive tape. This exemplary embodiment or another exemplary embodiment may further provide a vertical axis of the blade extending centrally from the upper end to the lower end; a lateral axis of the blade extending centrally from the first side edge to the second side edge, wherein the lateral axis is perpendicular to the vertical axis; wherein the blade is symmetrical about the vertical axis and the lateral axis.

In another aspect, an exemplary embodiment of the present disclosure may provide a method of manufacturing a tape dispenser comprising: aligning a blade with a dispensing end of a tape dispenser housing, wherein the blade includes a first row of teeth and a second row of teeth; coupling the blade to a portion of the housing near the dispensing end of the housing; securing the blade to the housing; exposing the first row of teeth adapted to cut adhesive tape that is unwound from a roll carried by housing; and orienting the second row of teeth in a direction that is adapted to remain unused when adhesive tape is cut. This exemplary embodiment or another exemplary embodiment may further provide providing an exposed row of teeth adapted to cut adhesive tape regardless of whether an upper end or a lower end of the blade is oriented above the other during the aligning of the blade with the dispensing end of the housing. This exemplary embodiment or another exemplary embodiment may further provide sliding the blade laterally into a slot formed near the dispensing end of the housing. This exemplary embodiment or another exemplary embodiment may further provide wherein orienting another row of teeth is accomplished by concealing another row of teeth within the housing adapted to remain unused when adhesive tape is cut.

In another aspect, and exemplary embodiment of the present disclosure may provide a cutter blade for use in a tape dispenser comprising: a first major surface opposite a second major surface; a first side edge and a second side edge bounding the first and second major surfaces; a first row of teeth extending between the first side edge and the second side edge, wherein the first row of teeth defines an upper end of the cutter blade bounding the first and second major surfaces; and a second row of teeth extending between the first side edge and the second side edge, wherein the second row of teeth defines a lower end of the cutter blade bounding the first and second major surfaces; wherein the cutter blade is sized to fit within a dispensing end of tape dispenser housing. This exemplary embodiment or another exemplary embodiment may further provide a bend in the cutter blade between the upper end and the lower end. This exemplary embodiment or another exemplary embodiment may further provide wherein bend is located approximately halfway between the upper end of the cutter blade and the lower end of the blade and extends fully from the first side edge to the second side edge, and wherein the bend in the cutter blade defines a convex portion on the first major surface and a concave portion on the second major surface.

In yet another aspect, an exemplary embodiment of the present disclosure may provide a tape dispenser having a cutter or cutting blade that has at least two rows of teeth opposite each other relative to the cutter or cutting blade. The blade is to be installed on the tape dispenser in any of at least two orientations. By installing the blade in any of at least two orientations, at least one row of teeth will always project from the dispensing end to cut adhesive tape as it is unwound from a roll after being dispensed. This type of blade permits an easier manufacturing ability by reducing or eliminating the need to ensure proper alignment of the teeth to project outwardly from the tape dispenser housing.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

A tape dispenser in accordance with one aspect of the present disclosure is shown generally at 10 throughout the figures. Notably, while tape dispenser 10 is a reusable-type of tape dispenser, the inventive concepts disclosed herein apply equally to non-reusable-type (i.e., disposable) tape dispensers, as well. Tape dispenser 10 has a two-sided or dual-sided cutter blade 40 that may be universally installed such that the blade 40 provides an exposed row of teeth from the tape dispenser near its dispensing end regardless of the way the blade 40 is installed. Stated otherwise, the cutter blade 40 is reversible and has a row of teeth along its upper edge and its lower edge as substantially described herein to reduce or eliminate a manufacturing step of ensuring proper alignment with the cutting teeth exposed in an outward direction.

Figure 1:
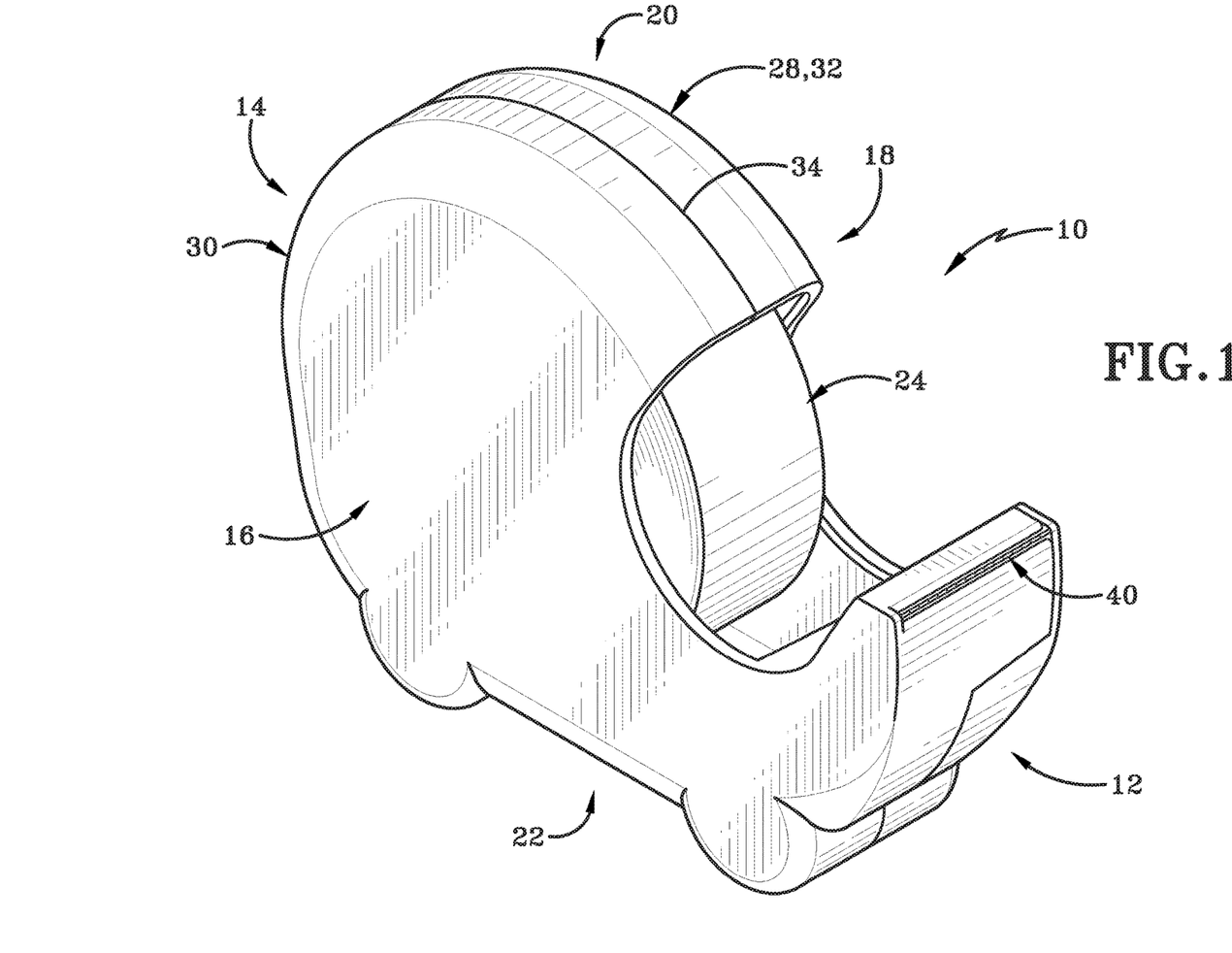
FIG. 1 is a perspective view of a tape dispenser having a two-sided or dual-sided cutter blade in accordance with an exemplary aspect of the present disclosure.

FIG. 1 depicts that tape dispenser 10 includes a dispensing end 12 opposite a rear end 14 defining a longitudinal direction therebetween. Tape dispenser 10 includes a first side 16 opposite a second side 18 defining a transverse or lateral direction therebetween. Tape dispenser 10 includes a top or upper end 20 opposite a bottom or lower end 22 defining a vertical direction therebetween. The vertical, transverse or lateral, and longitudinal directions are all orthogonal to each other.

Tape dispenser 10 includes a roll of wound adhesive tape 24 that is supported by a hub 26 (FIG. 3) that is housed within a housing 28 of the tape dispenser 10.

When the tape dispenser 10 is a reusable-type of tape dispenser, the housing 28 may be formed of two parts or two portions. A first part 30 of the housing 28 may releasably connect with a second part 32 of housing 28 to define a longitudinally extending union 34. A cylindrical support 36 (FIG. 3) may be on either the first part 30 or the second part 32 and project laterally relative to an inner surface thereof towards the other of the first part 30 or second part 32 and rotatably support the hub 26 thereon. As commonly understood, tape 24 may be dispensed from the tape dispenser housing 28 in a longitudinal direction towards the dispensing end 12.

Tape dispenser 10 includes the blade 40 positioned adjacent the dispensing end 12 of the housing 28 to cut the adhesive tape 24 after a portion of the adhesive tape is unwound. In accordance with one aspect of the present disclosure, the blade 40 includes at least two rows of teeth on the blade.

Figure 2:
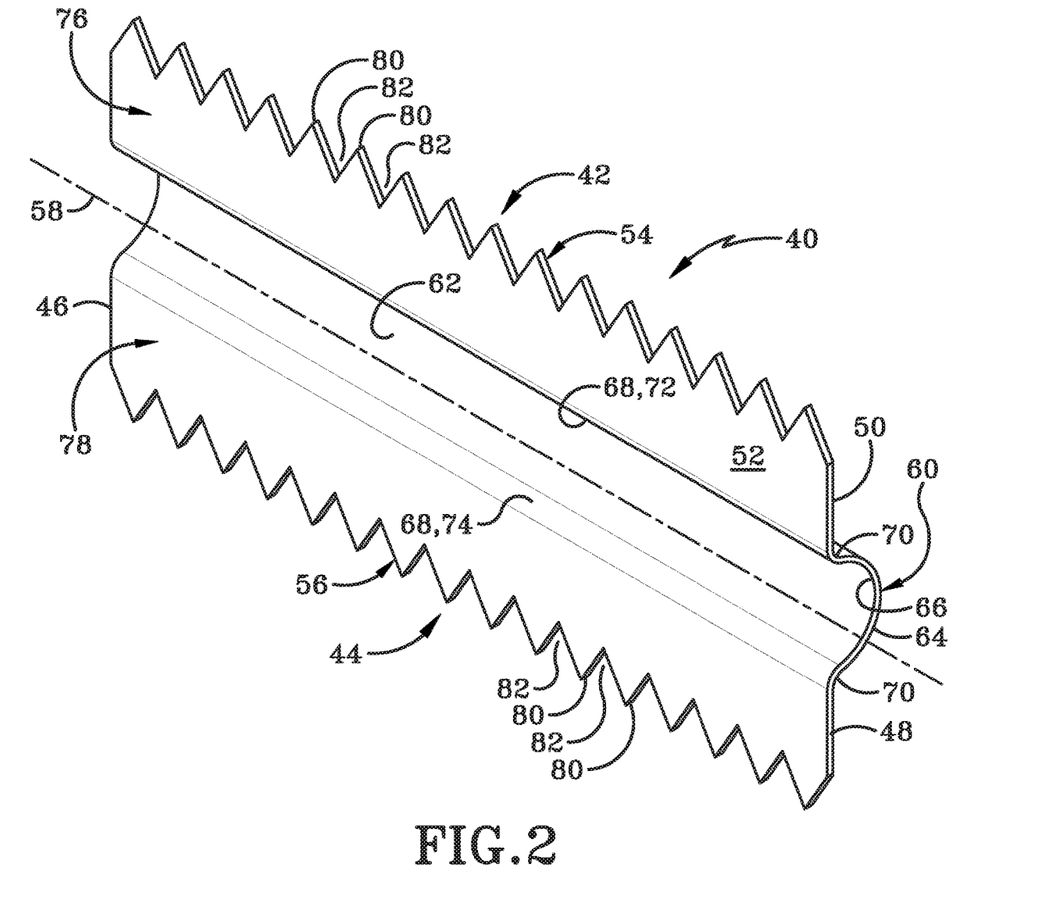
FIG. 2 is a perspective view of a two-sided or dual-sided cutter blade in accordance with one aspect of the present disclosure.

FIG. 2 depicts blade 40 that includes an upper edge 42 opposite a bottom edge 44 and a first side edge 46 opposite a second side edge 48. A first major surface of the blade 40 is bound between the upper and bottom edges 42, 44 and bound between the first and second side edges 46, 48. A second major surface 52 is opposite the first major surface 50 and bound between the upper and bottom edges 42, 44, and bound between the first and second side edges 46, 48. The upper edge 42 defines a first row of teeth 54 and the bottom edge 44 defines a second row of teeth 56. The first row of teeth face a first direction and the second row of teeth 56 face a second direction. The second direction is different than the first direction in which the first row of teeth 54 face. In one particular embodiment, the directional alignment of the first and second rows of teeth 54, 56 are opposite each other. Stated otherwise, the first direction in which the first row of teeth 54 face is about 180 degrees from the second direction in which the second row of teeth 56 face. The blade 40 is elongated in the lateral direction and defines a lateral axis 58. When the lateral axis 58 is centered between the upper edge 42 and the bottom edge 44, the first row of teeth 54 is offset to an opposite side of the lateral axis 58 relative to the second row of teeth 56.

With continued reference to FIG. 2, blade 40 includes a laterally elongated projection 60 extending from the first side edge 46 to the second side edge 48 in the direction of the lateral axis 58. In one particular embodiment, the projection 60 is centered between the upper edge 42 and the bottom edge 44. However, it is possible for the projection 60 to be located in other positions between the upper edge 42 and the bottom edge 44. Further, while it is shown that the projection 60 extends fully or entirely from the first side edge 46 to the second side edge 48, it is possible that the projection 60 only laterally extends a portion of the lateral length of the blade 40 so as to not fully extend between the first side edge 46 and the second side edge 48. In the embodiment shown in which the projection 60 extends entirely between the first side edge 46 and the second side edge 48, there is formed a channel 62 that extends entirely from the first side edge 46 to the second side edge 48. The channel 62 is defined by the projection 60 being offset and extending rearward from the first row of teeth 54 and the second row of teeth 56.

In one particular embodiment, projection 60 is formed by a bend in the blade 40 between the upper end 42 and the lower end 44 (in this particular instance, the bend is also denoted as reference numeral 60). The bend 60 may take on any geometrical configuration. In the embodiment as shown, which is exemplary, the bend defines a semi-cylindrical configuration that defines the channel 62. As such, the bend 60 defines a convex surface 64 on the first major surface 50 and a concave surface 66 on the second major surface 52. The convex surface 64 and the concave surface 66 may have the approximately same radius of curvature relative to lateral axis 58. However, it is to be understood that the radius of curvature of the convex surface and the concave surface 64, 66 may differ slightly due to the thickness of the blade 40 between the first major surface 50 and the second major surface 52. In one particular embodiment, the bend 60 is manufactured in the manner that creates first and second minor convex surfaces 68 in the second major surface 52 that straddle both sides of the concave surface 66. Similarly, bend 60 may define first and second minor concave surfaces 70 in the first major surface 50 that straddle the upper and lower ends of the convex surface 64. Collectively, the minor convex surfaces 68 and the minor concave surfaces 70 define a lateral first channel edge 72 and a lateral second channel edge 74 that bound the channel 62 and extend fully from the first side edge 46 to the second side edge 48. Blade 40 includes a top portion 76 that extends upwardly from the first channel edge 72 to the first row of teeth 54. Blade 40 includes a lower portion 78 that extends downwardly from the second lateral channel edge 74 to the second row of teeth 56. In one particular embodiment, the upper portion 76 and the lower portion 78 are dimensionally similar such that the blade may be considered symmetric relative to a vertical axis as well as symmetric relative to the lateral axis 58. Notably, the blade 40 could still remain symmetrical relative a vertical axis even if the projection or bend 60 is shifted slightly upward or slightly downward such that the upper portion or lower portion would be larger than the other as the case may be.

The first row of teeth 54 and the second row of teeth 56 are both dimensionally-sized and shaped in a manner that would result or effectuate the cutting of tape 24 after being unwound and dispensed towards the dispensing end 12 of the housing 28. Thus, the teeth 54, 56 may be considered identical replications of each other according to one aspect of the present disclosure. However, it is entirely possible for the first row of teeth 54 and the second row of teeth 56 to have different size cutting edges or cutting dimensions. However, in each instance, each row of teeth 54, 56 should be shaped and sized in a manner that would effectuate the cutting of tape 24. Stated otherwise, each row of teeth 54, 56 has linear edges that may be sharpened to define points 80 spaced between immediately adjacent valleys 82 on each side of each respective point 80, each row of teeth 54, 56 is sharpened in a manner that would result in easily cutting tape 24.

As described in greater detail herein, according to one exemplary aspect, blade 40 having first and second rows of teeth 54, 56 on each end of the blade 40 enables the blade 40 to be quickly installed in the dispensing end 12 of the housing 28 of tape dispenser 10 so as to eliminate or reduce the need of properly aligning the blade to ensure that teeth properly project outwardly from the dispensing end 12 of the housing 28 of tape dispenser 10. Thus, one row of teeth will remain unused during the dispensing action of tape dispenser 10 inasmuch as it will be oriented in a direction opposite the other row of teeth that is being used to cut the tape 24. This exemplary advantage enables the tape dispenser 10 to be assembled in a faster manner without requiring an assembly machine or assembly person to ensure that the row of teeth are properly projecting in the correct cutting direction. Namely, previous cutter blades that only have a single row of teeth must be properly aligned, and thus require an extra manufacturing step, to ensure that the single row of teeth project outwardly from the blade and the opposite edge that does not have a row of teeth would be secured within the housing. The two-sided or dual sided cutter blade 40 of the present disclosure enables each blade to be rapidly installed into the housing 28, or installed into one part, either first part 30 or second part 32, and ensures that at least one row of teeth, either the first row 54 or the second row 56, are always projecting outwardly from the dispensing end 12 of the housing 28.

Figure 3:
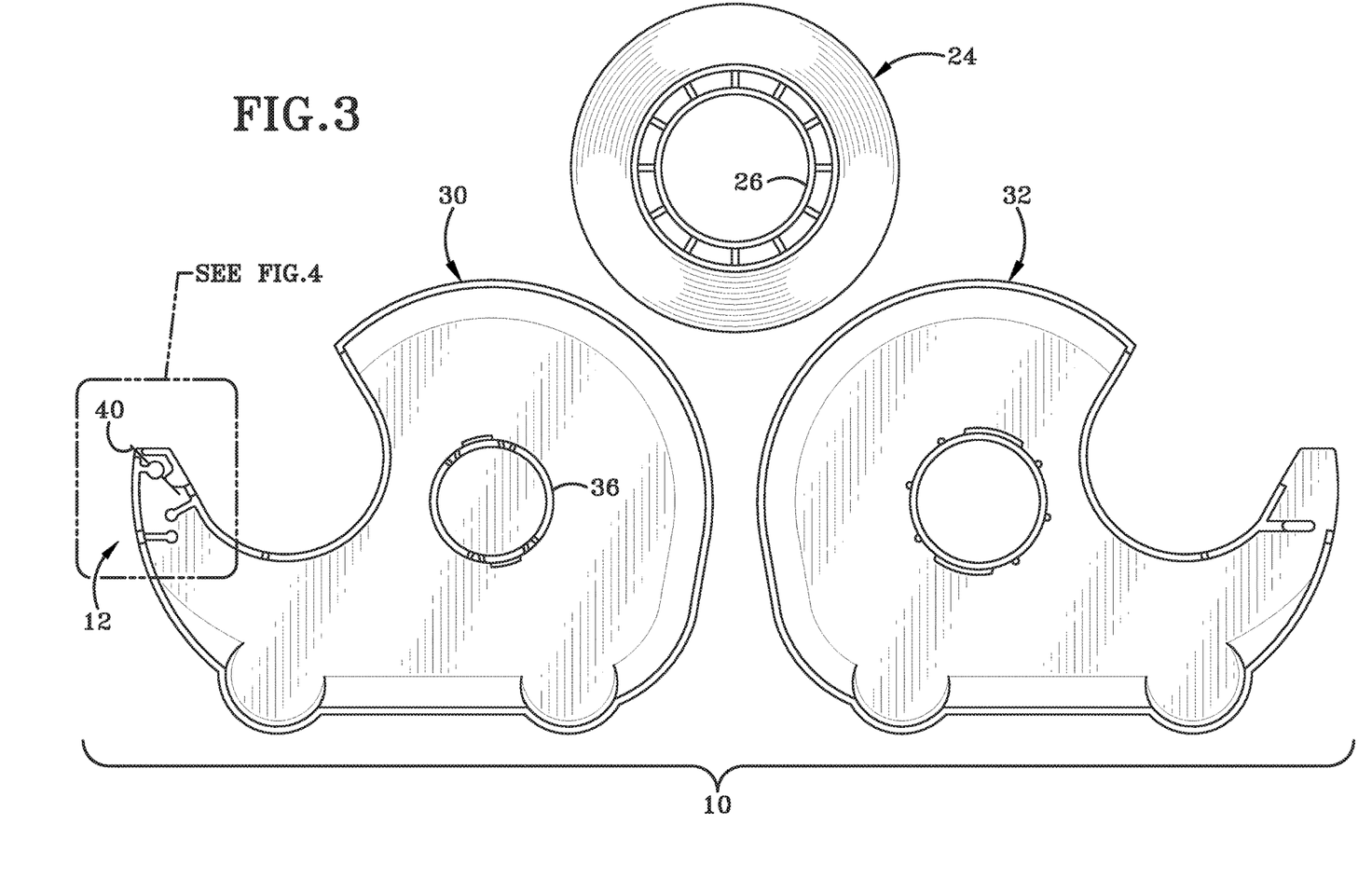
FIG. 3 is an exploded plan view of the tape dispenser of the present disclosure.
Figure 4:
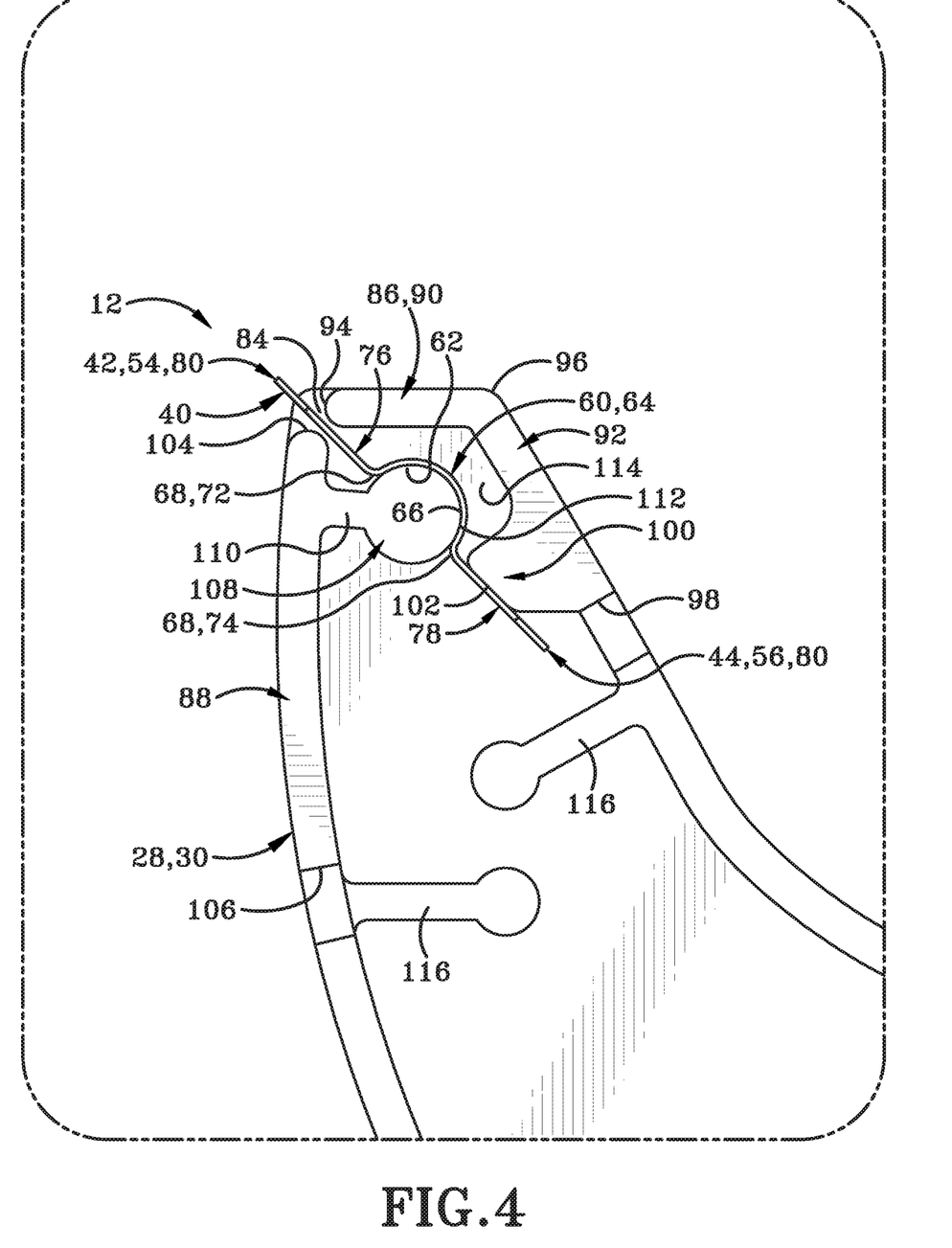
FIG. 4 is an enlarged plan view of the region labeled "SEE FIG. 4" in FIG. 3 depicting the two-sided or dual-sided cutter blade installed within a dispensing end of the tape dispenser housing.

FIG. 3 and FIG. 4 depict the assembled arrangement of the blade 40 in the housing 12. More particularly, as depicted in FIG. 3, an exploded view of the reusable tape dispenser 10 is shown with the blade 40 being affixed near the dispensing end 12 of the first part 30 of housing 28.

FIG. 4 depicts that the first part 30 of housing 28 defines an opening 84 at dispensing end 12. Opening 84 is defined between a first wall 86 and a second wall 88. First wall 86 includes a first leg 90 and a second leg 92. The first leg 90 has a primary axis extending from a terminal end 94 to a rear end 96. Second leg 92 extends rearward and downward from end 96 to a lower end 98. The primary axis of the second leg 92 extends from end 96 to end 98. The primary axis of the first leg 90 is approximately 120 degrees to approximately 150 degrees from the primary axis of the second leg 92. Second leg 92 may include a downward and forward projection 100 having a flat surface 102 that extends forwardly downward further from the rest of the second leg 92. The flat surface 102 is configured to contact the first major surface 50 on the lower portion 78 of blade 40 (or the surface 50 on the upper portion 76 if the blade is installed upside down).

Second wall 88 includes an upper terminal end 104 and a lower end 106. A cylinder or cylindrical extension 108 (which may also be referred to as a housing projection) is connected to the second wall 88 via a short connection wall 110 adjacent the upper terminal end 104. The cylinder 108 includes a convex outer surface 112. The radius of curvature of the convex outer surface 112 complements the radius of curvature of the concave surface 62 of the projection 60 of blade 40. Stated otherwise, the outer surface of cylinder 108 is shaped complementary to the inner surface of the projection 60. It will be appreciated that if the projection has a differing shape than a semi-circular bend, the shape of the cylinder would need to be changed in order to nest or complement the shape of the projection 60. Thus, if the projection 60 is formed in an angular manner, a similar angular outer surface complementary to that of the projection would be used to form cylinder 108. In this instance, the cylinder would not necessarily be considered a cylinder because it would not have a smooth convex outer surface but rather it would simply be a projection extending in a cantilevered manner from the inner surface of the first part 30.

With continued reference to FIG. 4, the housing 28 defines a slot 114 between the first wall 86 and the second wall 88. The slot is configured to slidably receive the blade therein. The blade 40 is to be slid within the slot 114 between the first wall 86 and the second wall 88. The slot receives the blade therein. When the blade 40 is slid within the slot 114 between the first wall 86 and the second wall 88, the blade 40 contacts portions of the housing, namely the first wall 86 and the second wall 88, in certain ways to provide a frictional interference fit to connect or secure the blade to the housing near the dispensing end 12. When the blade 40 is in this frictional interference connection with portions of the housing, one row of teeth projects outwardly from the dispensing end 12 through the opening 84 to be exposed so as to allow the teeth, which in this instance as shown is the first row of teeth 54, to cut tape as it is being dispensed. The frictional interference fit of the blade with the housing 28 also precludes the other row of teeth, which in this instance is the second row of teeth 56, from contacting the adhesive tape 24 while it is dispensed. The slot 114 is shaped complementary to a profile shape of the blade 40. As used herein, the profile shape of the blade refers to the shape of the blade in cross section. Thus, the profile shape of the blade, when viewed in cross section, has generally flat and vertical respective upper and lower surfaces defined by the upper portion 76 and the lower portion 78. Between the flat portions of the profile of the blade 40 is a geometric configuration defined by the projection 60. In the shown embodiments, the projection defines a semicircular or arcuate configuration that curves outwardly towards the direction of the first major surface. However, as explained in greater detail herein, the shape of the projection may take on any geometric configuration and could be angular such as the shape of a triangle or maybe square-shaped or any other geometric configuration.

In one particular exemplary aspect, and as shown is FIG. 4, when the blade 40 is connected with the housing 28, the first row of teeth 54 extend outwardly from the dispensing end 12 of the housing 28. The upper portion 76 of the blade 40 is disposed within the opening 84 defined between the terminal ends 94, 104 of the first leg 90 of the first wall 86 and the second wall 88, respectively. The convex outer surface 112 of cylinder 108 fits or nests within the channel 62 of blade 40 so as to contact the concave surface 66 of the projection or bend 60. The lower portion 78 is disposed in a manner such that it contacts the projection 100 on the second leg 92 of first wall 86 such that the flat wall 102 contacts the first major surface 50 of the blade 40 at the lower portion 78. The second row of teeth 56 are disposed within the housing in a downward manner that is opposite the projection of the first row of teeth 54.

With continued reference to FIG. 4, the housing may include other structural supports 116 to stiffen the dispensing end of the housing 28. The structural supports 116 may be formed in any configuration, shape or size to provide a sufficient rigidity to the dispensing end 12 of the tape dispenser 10. This is because the housing 28 is ordinarily formed of plastic material, thus structural supports may strengthen the dispensing end 12 of the housing 28 of tape dispenser 10.

FIG. 5A-5E depict the assembly of tape dispenser 10 according to an exemplary method of the present disclosure of the blade with the housing 28. In short, FIG. 5A-5E depict aligning the blade 40 with dispensing end 12 of the housing 28. Then, coupling the blade 40 to the housing near its dispensing end 12 and securing the blade thereto. Then, securing, which has been described herein as a frictional interference fit, could also be accomplished through using any chemical means, mechanical means, or any non-chemical and non-mechanical means. Positioning the blade in this orientation exposes at least one row of teeth which is adapted to cut the adhesive tape 24 as it is unwound from the housing 28. This also orients the second row of teeth in a direction that is adapted to remain unused when the adhesive tape 24 is cut.

Figure 5A:
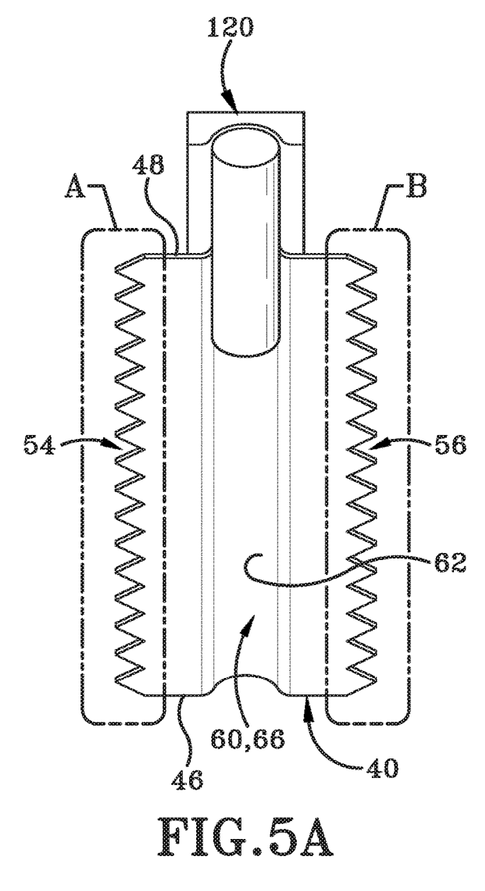
FIG. 5A is a top perspective view of the cutter blade in a first orientation.
Figure 5B:
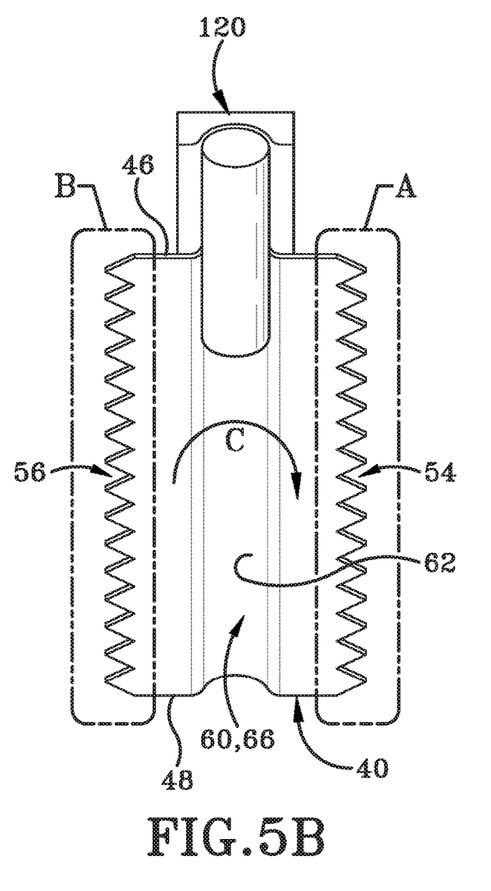
FIG. 5B is a top perspective view of the cutter blade in a second orientation.

FIG. 5A and FIG. 5B depict the universality of blade 40. FIG. 5A depicts that the blade 40 may be oriented in a first configuration and FIG. 5B depicts that the blade may be oriented in a second configuration. Namely, the first row of teeth 54 are shown by exemplary dot-dash box A and the second row of teeth 56 are enclosed with an exemplary dot-dash box B. In FIG. 5B the blade 40 is shown as having been rotated 180 degrees, as indicated by Arrow C, in which the first row of teeth 54 are enclosed by exemplary dot-dash box A and a second row of teeth 54 are enclosed by exemplary dot-dash box B. When in the first orientation (FIG. 5A), the first side edge 46 is oriented downward and the second side edge 48 is oriented upward. In the second configuration (FIG. 56), the second side edge 48 is oriented downward and the first side edge 46 is oriented upward.

FIG. 5A and FIG. 5B further depict an exemplary tool 120 that could be used to grasp the blade 40 via the projection 60 to allow it to be inserted into the housing 20. However, the shape of the tool 120 may be any configuration suitable to grasp the blade 40 in either the first configuration (FIG. 5A) or the second configuration (FIG. 56). Thus, tool 120 does not need to have a cylinder that is shaped complementary to the projection 60. For example, the elimination of tool 120 is entirely possible and the insertion of the blade into the housing could be accomplished by hand.

Figure 5C:
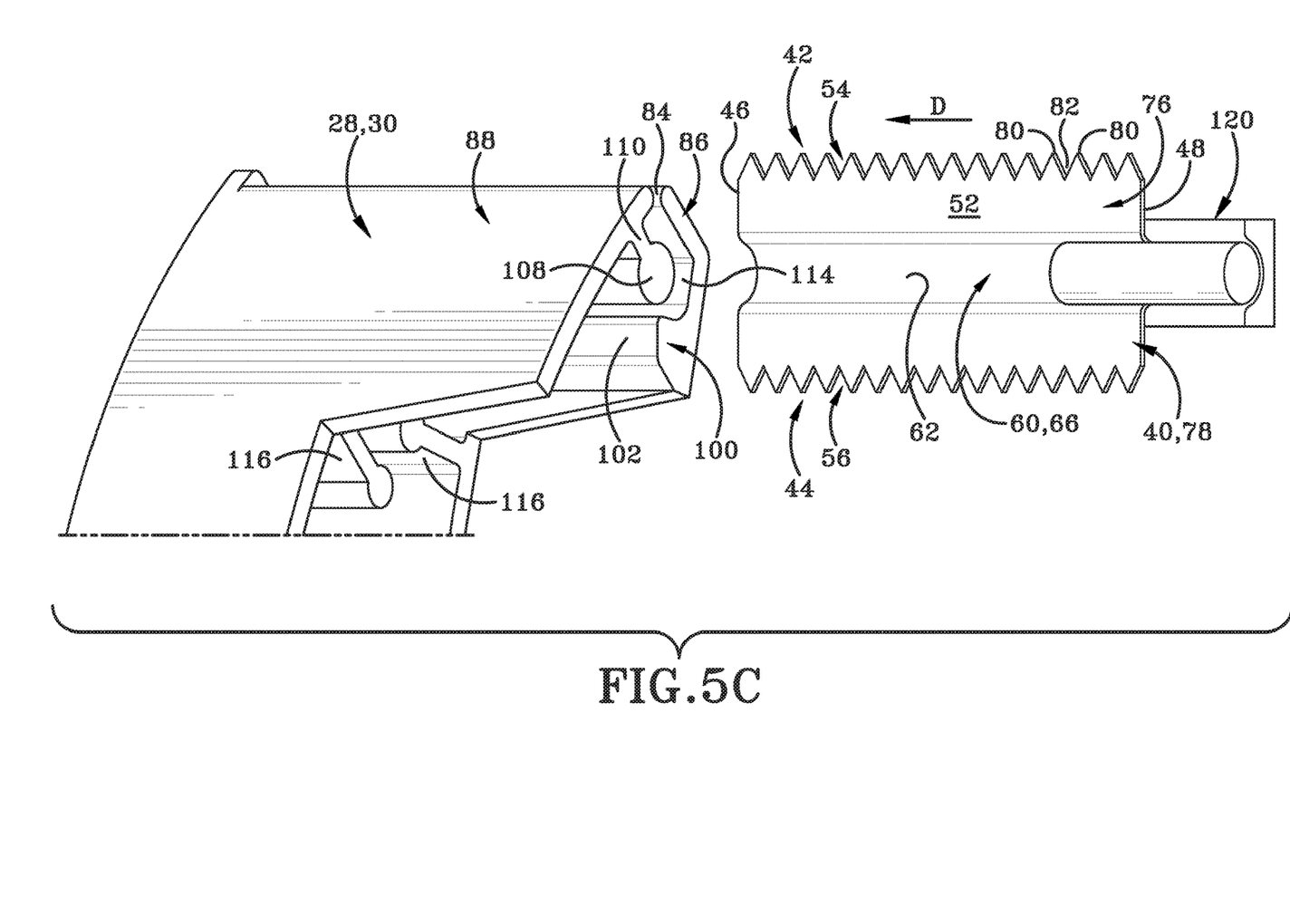
FIG. 5C is an operational perspective view of the cutter blade being installed into the tape dispenser housing regardless of the orientation of the cutter blade shown in FIG. 5A and FIG. 5B.

FIG. 5C depicts the insertion of the blade, which may be in either orientation, laterally in the direction of Arrow D. FIG. 5C assumes the orientation shown in FIG. 5A such that the first side edge 46 laterally approaches the slot 114 defined between the first wall 86 and the second wall 88. The insertion of the blade 40 into the slot 114 disposes the cylinder 108 within the channel 62 of the blade as described above with reference to FIG. 4.

Figure 5D:
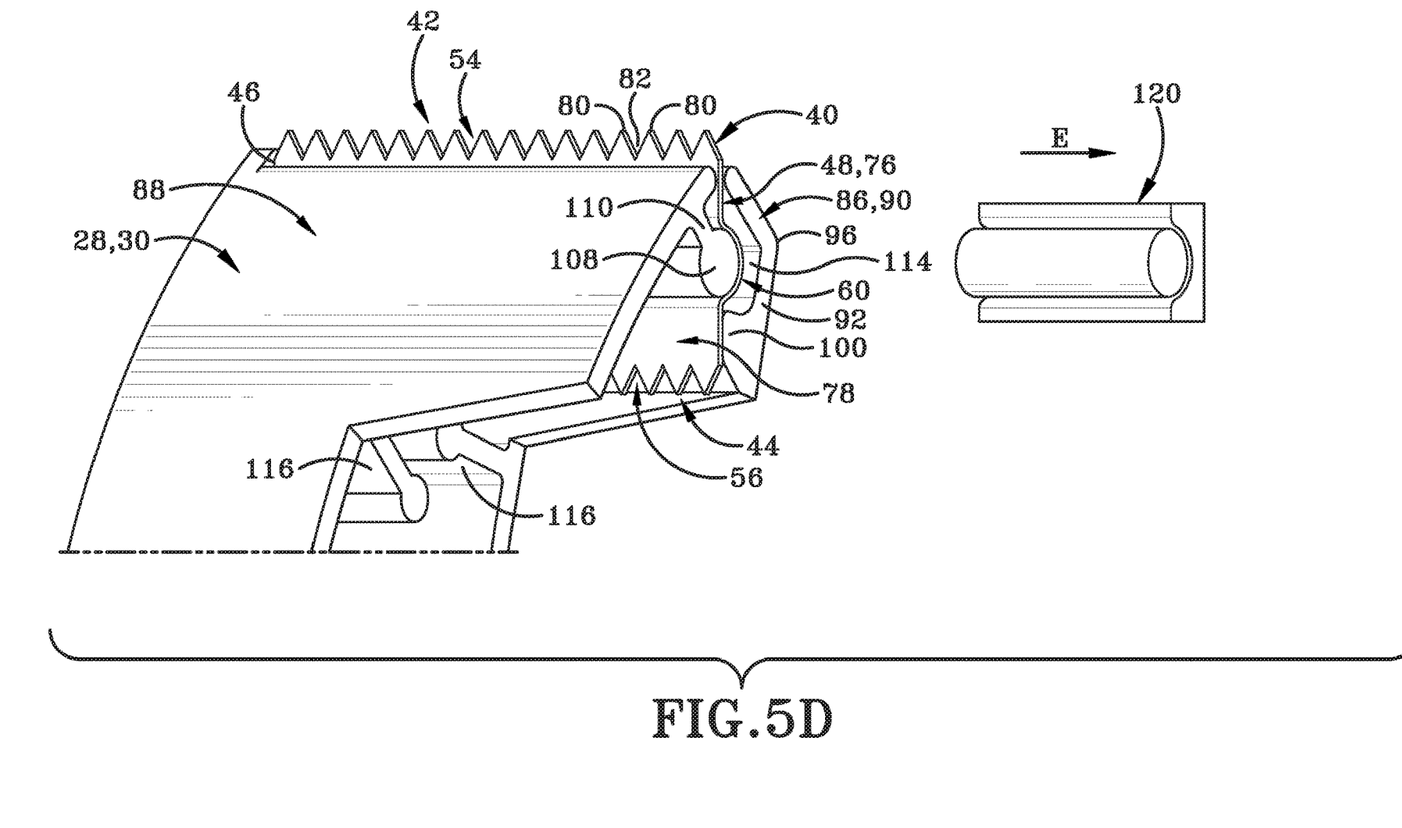
FIG. 5D is an operational perspective view of a tool being removed after installing the cutter blade into the tape dispenser housing.

FIG. 5D depicts the removal of the tool 120 in the direction of Arrow E which is opposite that the Arrow D. The removal of the tool 120 positions the blade 40 within the dispensing end of the housing 28 of tape dispenser 10 in a configuration such that the first row of teeth 54 are exposed outwardly to cut the tape 24 while the second of teeth 56 remain unused. While the second row of teeth remain unused during the cutting action of the tape 24, it is not to say that this second row of teeth 56 are without benefit. Namely, the symmetrical nature of the blade 40 enables the blade 40 to be picked up by the tool 120, or by an assembly person's hands and so long as the tool connects with the blade 40, the step of orienting the teeth in the proper direction is eliminated or significantly reduced inasmuch as regardless of which orientation the tool inserts the blade 40 into the housing 28 (the two orientations are shown in FIG. 5A and FIG. 56), at least one row of teeth will always be exposed outwardly through the opening 84 at the dispensing end 12 of the housing 28 which will allow the exposed teeth to cut the tape 24 as it is dispensed from its roll. As such, while there is one row of teeth that is exposed after sliding the blade laterally into the slot 114 form near the dispensing end 12 of the housing, there is another row of teeth that is concealed within the housing and are configured or adapted to remain unused during the cutting action of the adhesive tape.

Figure 5E:
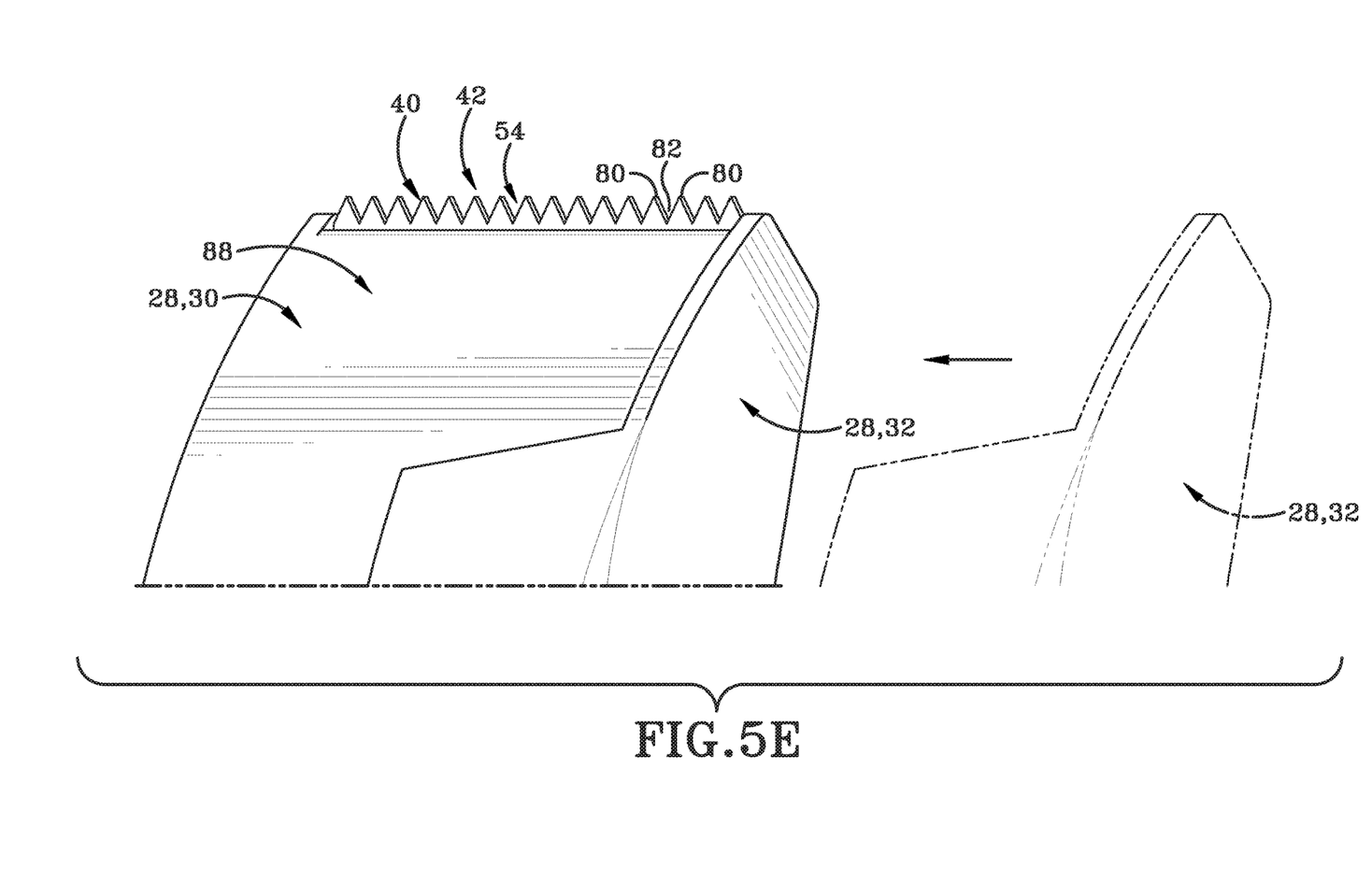
FIG. 5E is an operational perspective view of the dispensing end of the housing depicting a part of the housing being connected with another part of the housing to secure the dual-sided cutter blade therein.

FIG. 5E completes the assembly process in which the second part 32 of housing 28 is releasably connected to the first part 30. The manner in which the second part 32 connects to the first part 38 of housing 28 may be accomplished in any conventionally known manner; however, it is envisioned that a simple press fit mechanical connection using spring tabs or other pliable plastic connectors could be the most simple connection mechanism.

Another exemplary advantage of the blade 40 is that it may be reversible in the event one row of teeth is ever dulled and needs replaced. In this instance, rather than replacing a new blade with a new row of teeth, a user of the tape dispenser 10 may simply disconnect the first part 30 from the second part 32. Then, the user may pry and slidably remove the blade from its connection with the housing by extracting it from the slot 114. The blade then may be reversed such that the other row of teeth is oriented to face an opposite direction than it was previously disposed. The user may then slidably reinsert the same blade in the opposite configuration back into the slot 114 and connect the first and second parts 30, 32 back together and have an exposed row of teeth that were previously unused and would be in a sharp condition, thus doubling the lifespan of the blade 40.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0. % of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, any method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clarity, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed:

1. A tape dispenser comprising:
a housing sized to dispense adhesive tape wound in a roll carried by the housing, the housing including a housing projection within the housing, wherein the housing projection is laterally aligned and cantilevered from a wall of the housing;
a dispensing end of the housing;
a blade adjacent the dispensing end of the housing to cut the adhesive tape after a portion of adhesive tape is unwound from the roll, the blade comprising a planar top first portion defining an upper end of the blade, a planar bottom second portion defining a lower end of the blade, and the blade comprising a bend between the first portion and the second portion, wherein the bend defines a channel extending laterally across the blade; and
at least two rows of teeth on the blade; and
wherein the housing projection is disposed within the channel adapted to retain the blade in an fixed position.

2. The tape dispenser of claim 1, wherein the two rows of teeth on the blade comprises:
a first row of teeth facing a first direction;
a second row of teeth facing a second direction that is different than the first direction.

3. The tape dispenser of claim 2, wherein the first direction is about 180° from the second direction.

4. The tape dispenser of claim 1, wherein the blade comprises:
a first side edge and a second side edge;
a first major surface opposite a second major surface, wherein the first and second major surfaces are bounded between the first side edge and the second side edge;
wherein the at least two rows of teeth on the blade includes a first row of teeth extending between the first side edge and the second side edge and bounding the first and second major surfaces;
wherein the at least two rows of teeth on the blade includes a second row of teeth extending between the first side edge and the second side edge and bounding the first and second major surfaces.

5. The tape dispenser of claim 4, further comprising:
an upper end of the blade defined by the first row of teeth; and
a lower end of the blade defined by the second row of teeth.

6. The tape dispenser of claim 5, wherein the bend is located approximately halfway between the upper end of the blade and the lower end of the blade and extends fully from the first side edge to the second side edge.

7. The tape dispenser of claim 5, wherein the bend in the blade defines a convex portion on the first major surface and a concave portion of the channel on the second major surface.

8. The tape dispenser of claim 5, further comprising:
a vertical axis of the blade extending centrally from the upper end to the lower end;
a lateral axis of the blade extending centrally from the first side edge to the second side edge, wherein the lateral axis is perpendicular to the vertical axis;
wherein the blade is symmetrical about the vertical axis and the lateral axis.

9. The tape dispenser of claim 1, further comprising:
a slot defined at the dispensing end of the housing, wherein the slot is shaped complementary to a profile shape of the blade.

10. The tape dispenser of claim 1, further comprising:
a connection of the blade to the housing to preclude the second row of teeth from contacting the adhesive tape.

11. The tape dispenser of claim 1, wherein the blade is secured to the housing projection via a frictional interference fit.

12. A method of manufacturing a tape dispenser comprising:
aligning a blade with a dispensing end of a tape dispenser housing, wherein the blade includes a first row of teeth and a second row of teeth;
sliding the blade laterally into a slot formed near the dispensing end of the housing;
coupling the blade to a portion of the housing at the dispensing end of the housing, wherein the portion of the housing is a projection extending from a wall of the tape dispenser housing, and wherein coupling the blade to the portion of the housing is accomplished by disposing the projection within a channel defined in the blade and the channel located between a planar first portion and a planar second portion of the blade, wherein the projection is shaped complementary to the channel;

securing the blade to the housing;

exposing the first row of teeth adapted to cut adhesive tape that is unwound from a roll carried by housing; and orienting the second row of teeth in a direction that is adapted to remain unused when adhesive tape is cut.

13. The method of manufacturing a tape dispenser of claim 12, further comprising:

providing an exposed row of teeth adapted to cut adhesive tape regardless of whether an upper end or a lower end of the blade is oriented above the other during the aligning of the blade with the dispensing end of the housing.

14. The method of manufacturing a tape dispenser of claim 12, further comprising:

wherein orienting another row of teeth is accomplished by concealing another row of teeth within the housing adapted to remain unused when adhesive tape is cut.

15. The method of manufacturing a tape dispenser of claim 12, wherein securing the blade to the housing is accomplished via a frictional interference fit.

\* \* \* \* \*